(12) United States Patent
Matsushita et al.

(10) Patent No.: US 8,154,079 B2
(45) Date of Patent: Apr. 10, 2012

(54) SEMICONDUCTOR DEVICE AND FABRICATION METHOD OF THE SEMICONDUCTOR DEVICE

(75) Inventors: Keiichi Matsushita, Kawasaki (JP); Kazutaka Takagi, Kawasaki (JP); Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 543 days.

(21) Appl. No.: 12/300,795

(22) PCT Filed: Nov. 28, 2007

(86) PCT No.: PCT/JP2007/072953
§ 371 (c)(1),
(2), (4) Date: Nov. 14, 2008

(87) PCT Pub. No.: WO2008/069074
PCT Pub. Date: Jun. 12, 2008

(65) Prior Publication Data
US 2009/0256210 A1   Oct. 15, 2009

(30) Foreign Application Priority Data

Dec. 7, 2006  (JP) ................................. 2006-330337
Dec. 15, 2006 (JP) ................................. 2006-338609

(51) Int. Cl.
*H01L 31/113* (2006.01)
(52) U.S. Cl. ........ 257/343; 257/341; 257/340; 257/346; 257/347
(58) Field of Classification Search .................. 257/347, 257/340–341, 343, 346
See application file for complete search history.

(56) References Cited

U.S. PATENT DOCUMENTS

| | | | |
|---|---|---|---|
| 5,187,547 A | 2/1993 | Niina et al. | |
| 5,429,954 A | 7/1995 | Gerner | |
| 2006/0145189 A1 | 7/2006 | Beach | |

FOREIGN PATENT DOCUMENTS

| | | |
|---|---|---|
| EP | 0 405 757 A2 | 1/1991 |
| JP | 4 11743 | 1/1992 |
| JP | 6-151959 | 5/1994 |
| JP | 6 349859 | 12/1994 |
| JP | 9 205211 | 8/1997 |

(Continued)

OTHER PUBLICATIONS

European Communication Report issued on Aug. 15, 2011 in corresponding European Application No. 07 832 675.8.

(Continued)

*Primary Examiner* — Samuel Gebremariam
(74) *Attorney, Agent, or Firm* — Oblon, Spivak, McClelland, Maier & Neustadt, L.L.P.

(57) ABSTRACT

A semiconductor device, which can prevent an element breakdown by alleviating of electric field concentrations, and can also prevent reduction of gain, includes: a source electrode formed on a semiconductor layer; a drain electrode formed on the semiconductor layer; a gate electrode formed between the source electrode and the drain electrode; an insulating film formed on the semiconductor layer and the gate electrode; a field plate electrode formed on the insulating film; and a resistor for connecting the field plate electrode and the source electrode.

13 Claims, 7 Drawing Sheets

FOREIGN PATENT DOCUMENTS

| | | |
|---|---|---|
| JP | 10-326910 | 12/1998 |
| JP | 2000 315804 | 11/2000 |
| JP | 2002 231733 | 8/2002 |
| JP | 2003 110197 | 4/2003 |
| JP | 2006 86398 | 3/2006 |
| JP | 2006 351753 | 12/2006 |
| WO | WO 03/030271 A2 | 4/2003 |

OTHER PUBLICATIONS

Hongtao Xu et al., "A New Field-Plated GaN HEMT Structure with Improved Power and Noise Performance", International Journal of High Speed Electronics and Systems, vol. 14, No. 3, 2004, pp. 810-815.

Office Action issued Aug. 2, 2011, in Taiwanese Patent Application No. 096146593.

SEMICONDUCTOR DEVICE AND FABRICATION METHOD OF THE SEMICONDUCTOR DEVICE

TECHNICAL FIELD

The present invention relates to a semiconductor device and a fabrication method of the semiconductor device, in particular relates to a GaN (gallium nitride) based FET (field effect transistor) for high frequency and a fabrication method thereof.

BACKGROUND ART

In a high frequency and high power semiconductor device (FET) using compound semiconductor, such as GaN, since high voltage is applied to a drain electrode, electric field concentrations occur in a corner of a gate electrode, and therefore a semiconductor element may be collapsed.

Conventionally, technology of alleviating the electric field concentrations in the gate electrode and preventing collapse of the semiconductor element is known, by providing a field plate as the fourth electrode on an insulating layer between a gate electrode and a source electrode, and electrically connecting the field plate to the source electrode.

Figure 11:
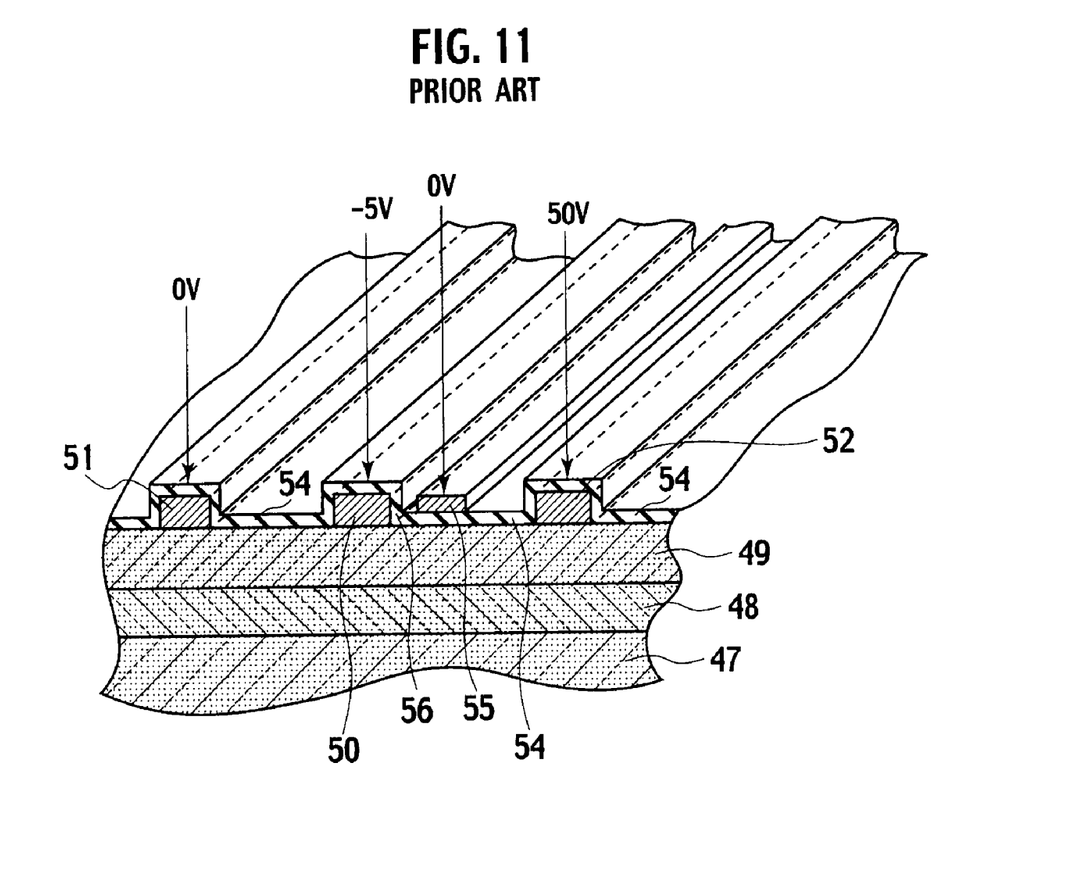
FIG. 11 A bird's-eye view including a schematic section structure for explaining an electrode configuration of a conventional semiconductor device.

FIG. 11 is a sectional view showing an example of a semiconductor device, which provides such the field plate electrode. As the semiconductor device is shown in the figure, a GaN layer 48 and an AlGaN (gallium aluminum nitride) layer 49 is epitaxially grown on a semi insulating SiC (carbonization silicon) 47; and a gate electrode 50 which is a Schottky electrode, and a source electrode 51 and a drain electrode 52 which are ohmic electrodes are formed on the surface of the AlGaN layer 49. The gate electrode 50, the source electrode 51, and the drain electrode 52 of each other are disposed in parallel. The surface of the AlGaN layer 49 including these electrodes is covered with an insulating film 54. On the insulating film 54, a field plate electrode 55 is provided between the gate electrode 50 and the drain electrode 52.

Similarly the field plate electrode 55 is formed by a conductor of stripe shape, and is disposed in parallel with the gate electrode 50 and the drain electrode 52. The field plate electrode 55 is used in parallel to the gate electrode 50 or the part is used by overlapping in that width direction although not illustrated, and is connected to the source electrode 51 by wiring members, such as a wire, and is held at the same potential as the source electrode 51.

With the field plate electrode 55, electric field concentrations induced in an edge part 56 of the gate electrode 50 by high drain voltage are alleviated. Accordingly, as for breakdown voltage of the FET improving by the field plate electrode 55 and a current collapse phenomenon being suppressed, inventions described in Patent Document 1 and Patent Document 2 is known, for example.

Patent Document 1: Japanese Patent Application Laid-Open No. H09-205211,
Patent Document 2: Japanese Patent Application Laid-Open No. 2002-231733.

However, parasitic capacitance is induced in the gate electrode 50 by disposing the field plate electrode 55 near the gate electrode 50. Moreover, as for a part, which the gate electrode 50 and the field plate electrode 55 overlap, the parasitic capacitance becomes large, and the amplifying characteristic of FET in a high frequency region deteriorates. That is, a gain of FET reduces by the parasitic capacitance. And, reduction of the gain is so large that film thickness of the insulating film 54 under the field plate electrode 55 is thin.

Thus, prevention of current collapse of FET by the field plate electrode, which is the fourth electrode, or improvement in breakdown voltage and amplifying gain of FET has a relation of a trade-off mutually.

DISCLOSURE OF INVENTION

An object of the present invention is to provide a semiconductor device, which can solve the relation of the trade-off and also prevent reduction of gain while preventing an element breakdown by relief of the electric field concentrations.

Furthermore, in light of the above-mentioned problems, the object of the present invention is to provide a semiconductor device and a fabrication method of the semiconductor device which can make small size which an electrode on an element occupies, and can perform simple fabricating, in the semiconductor device provided with the fourth electrode in which a high frequency signal is output and input.

According to one aspect of the present invention for achieving the above-mentioned object, a semiconductor device including: a nitride based compound semiconductor layer disposed on a substrate; a source electrode disposed on the semiconductor layer; a drain electrode disposed in a position on the semiconductor layer spaced out from the source electrode; a gate electrode disposed on the semiconductor layer between the drain electrode and the source electrode; an insulating film disposed on the semiconductor layer and on the gate electrode so as to cover the gate electrode; a field plate electrode disposed on the insulating film; and a resistor for connecting the field plate electrode and the source electrode; wherein the resistor has a greater value of resistance than high frequency impedance of stray capacity between the gate electrode and the field plate electrode, is provided.

According to another aspect of the present invention, a semiconductor device comprising: a nitride based compound semiconductor layer disposed on a substrate; a source electrode disposed on the semiconductor layer; a drain electrode disposed in a position on the semiconductor layer spaced out from the source electrode; a gate electrode disposed on the semiconductor layer between the drain electrode and the source electrode; an insulating film disposed on the semiconductor layer and on the gate electrode so as to cover the gate electrode; a field plate disposed on the insulating film; and a resistor for connecting the field plate and the source electrode; wherein the resistor has a greater value of resistance than high frequency impedance of stray capacity between the gate electrode and the field plate, and is formed by a sheet resistance of the semiconductor layer, is provided.

According to other one aspect of a present invention, a fabrication method of a semiconductor device comprising: separating electrically a unit FET and a predetermined region on a nitride based compound semiconductor layer, the unit FET having one each of a source electrode formed on the nitride based compound semiconductor layer formed on a substrate, a drain electrode formed in a position on the semiconductor layer spaced out from the source electrode, and the gate electrodes formed on the semiconductor layer between the drain electrode and the source electrode; vapor-depositing Ti/Al to the semiconductor layer, and forming an ohmic electrode; vapor-depositing Ni/Au to the semiconductor layer, and forming a Schottky electrode; forming an insulating film composed of SiN or $SiO_2$ on the semiconductor layer and on the gate electrode so as to cover the gate electrode; forming a trench which passes through the insulating film by etching;

BRIEF DESCRIPTION OF THE DRAWINGS

FIG. 5 (a) A schematic plane pattern configuration diagram of a semiconductor device according to a third embodiment of the present invention. (b) A schematic plane pattern configuration diagram of a semiconductor device according to the modified example of the third embodiment of the present invention.

BEST MODE FOR CARRYING OUT THE INVENTION

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

In the following explanation, a semiconductor element is formed on a substrate selected from a SiC substrate, a GaN/SiC substrate, an AlGaN/GaN/SiC substrate, a diamond substrate, and a sapphire substrate.

In particular, for example, when using the AlGaN/GaN/SiC substrate, the semiconductor element is composed as an HEMT (High Electron Mobility Transistor) using the high electron mobility in 2D EG (Two Dimensional Electron Gas) induced by the heterojunction interface. Moreover, for example, when using the GaN/SiC substrate, the semiconductor element can be composed as an MES (Metal semiconductor) FET using a Schottky Gate.

First Embodiment

Figure 1:
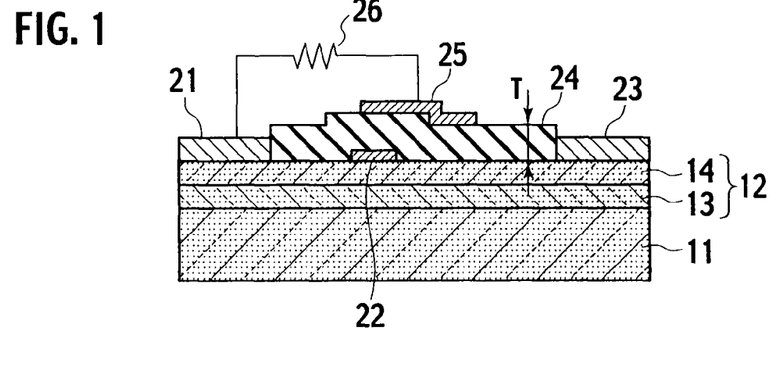
FIG. 1 A schematic section structure view of a semiconductor device according to a first embodiment of the present invention.
Figure 2:
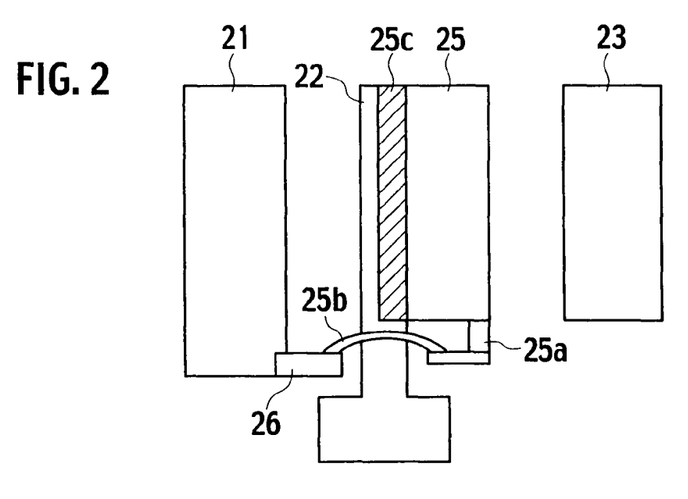
FIG. 2 A schematic plane pattern configuration diagram showing electrode placement of the semiconductor device according to the first embodiment of the present invention.
Figure 3:
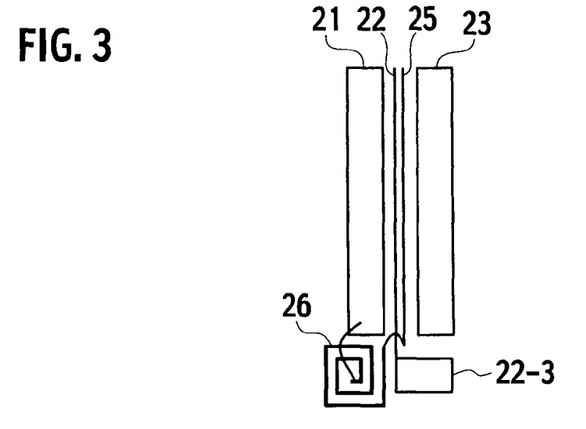
FIG. 3 A plane pattern configuration diagram showing an example of a resistor by the metallic thin film in the semiconductor device according to the first embodiment of the present invention.

FIG. 1 shows a schematic section structure view of a semiconductor device according to a first embodiment of the present invention. Moreover, FIG. 2 shows a schematic plane pattern configuration diagram showing placement of an electrode of the semiconductor device according to the first embodiment of the present invention. Moreover, FIG. 3 shows a plane pattern configuration diagram showing an example of a resistor by a metallic thin film in the semiconductor device according to the first embodiment of the present invention.

The semiconductor device according to the first embodiment of the present invention includes a gallium nitride based compound semiconductor layer 12 formed on a substrate 11, as shown in FIG. 1 and FIG. 2. The compound semiconductor layer 12 includes a GaN layer 13 formed on the substrate 11, and an AlGaN layer 14 formed on the GaN layer 13. A source electrode 21, a gate electrode 22, and a drain electrode 23 are provided on the surface of the compound semiconductor layer 12, i.e., the surface of the AlGaN layer 14. At this point, the source electrode 21 and the drain electrode 23 are formed, for example by the conductor of the stripe shape of Al, and are installed by ohmic contact for the AlGaN layer 14. Moreover, the gate electrode 22 is formed by the conductor of the stripe shape of Au, and is installed by the Schottky contact for the AlGaN layer 14. An insulating film 24, such as a nitride, is formed in the surface of the AlGaN layer 14 at a part except for the source electrode 21, the gate electrode 22 and the drain electrode 23. On the surface of the insulating film 24, a field plate electrode 25 which is the fourth electrode in parallel with the gate electrode 22 is formed, or the field plate electrode 25 is formed so that the gate electrode 22 may be covered in a part as shown by the reference numeral 25c of FIG. 2. The field plate electrode 25 is formed, for example, by the stripe-shaped conductor of Au. The field plate electrode 25 is connected to the source electrode 21 through a resistor 26, which has high resistance. That is, as shown in FIG. 2, as for the resistor 26, one end is connected to the lower edge of the source electrode 21, and the other end is connected to a wiring member 25a of the lower edge of the field plate electrode 25 through a wiring member 25b ranging over the gate electrode 22.

The resistance of the resistor 26 has a sufficiently high value compared with the impedance for the high frequency signal which the parasitic capacitance between the field plate electrode 25 and the gate electrode 22 uses.

The parasitic capacitance $C_{GFP}$ is calculated by $$C_{GFP} = \in \times S/T,$$

where the thickness of the insulating film 24 between the field plate electrode 25 and the gate electrode 22 is T, the dielectric constant is $\in$, and the size of against which the field plate electrode 25 and the gate electrode 22 stand face to face is S. The impedance for the high frequency signal which the parasitic capacitance uses is expressed with $1/(\omega C_{GFP})$, where angular frequency of the high frequency signal to be used is $\omega$. Therefore, the resistance R of the resistor 26 is selected so that it may become $$R \gg 1/(\omega \times C_{GFP}).$$

When the resistance is calculated using a concrete example, it is as follows. The capacity $C_{GFP}$ per gate width of 1 mm is almost set to $$C_{GFP} = 7 \times 8.854 \times 10^{-12} \times 1 \times 10^{-6} \times 1 \times 10^{-3} / (0.2 \times 10^{-6})$$
$$= 0.310 \times 10^{-12} \text{ (F/mm)},$$

where the width against which the field plate electrode 25 and the gate electrode 22 stand face to face is 1 micrometer, gate width (the length of the stripe shape conductor) is 1 mm, relative permittivity $\in_r$ of SiN is 7, the dielectric constant $\in_0$ in a vacuum is $8.854 \times 10^{-12}$ (F/m), and thickness of the insulating film 24 is 0.2 micrometer. The resistance R over the gate width of 1 mm is selected by a value, which satisfies $$R >> 1/(\omega \times C_{GFP}) = 50(\Omega),$$

where the operating frequency is, for example, 10 GHz.

In the multi-finger type FET according to the first embodiment, since the gate width in the unit transistor, i.e., one couple of gate electrodes 22, the source electrode 21 and the drain electrode 23 is 100 micrometers, it is preferable to insert the resistor 26 which has the resistance of at least 500 ($\Omega$) for every unit transistor, or the resistor 26 which has the resistance of about 5 (k$\Omega$) as the resistance greater enough than 500 ($\Omega$), between the field plate electrode 25 and the source electrode 21.

In the compound semiconductor device composed in this way, for example, when the source electrode 21 is set to ground potential, i.e., 0(V), and the gate electrode 22 is applied to DC bias voltage of −5(V) and the drain electrode 23 is applied to DC bias voltage of +50(V), and a high frequency signal is supplied between the source electrode 21 and the gate electrode 22, an amplified high frequency signal is output to the drain electrode 23. At this time, although a high voltage of 55(V) is applied between the gate electrode 22 and the drain electrode 23, since the field plate electrode 25 is provided, electric field concentrations are alleviated and collapse of the element by destruction of the insulating film 24 is avoided.

That is, since the field plate electrode 25 is separated through the insulating film 24 from the gate electrode 22, the direct current does not flow into between them. However, since the field plate electrode 25 is connected to the source electrode 22 through the resistor 26, the direct current potential is maintained to 0(V). Accordingly, the electric field concentrations for the gate electrode 22 can be alleviated.

On the other hand, since the field plate electrode 25 is connected to the gate electrode 22 through low impedance formed by the parasitic capacitance between the field plate electrode 25 and the gate electrode 22, for a high frequency signal, and high frequency current flows into the resistor 26, the field plate electrode 25 can be substantially changed into an open state from the gate electrode 22 by enlarging the resistance enough, and the parasitic capacitance between the field plate electrode 25 and the gate electrode 22 can be reduced.

By the way, it is preferable to form the resistor 26 superficially through an insulating film on the surface of the semiconductor layer 12 as the resistor provided in the compound semiconductor device for applying the present invention. The resistivity p of a metallic material of a typical resistor, the sheet resistance value at t=0.1 micrometer in thickness, and the length of resistance of 500 ($\Omega$) in the case where the line width is 1 micrometer are shown in Table 1.

TABLE 1

| Kind of Metal | Resistance $\rho$ ($10^{-8}$ $\Omega$m) | Sheet Resistance in t = 0.1 micrometer ($\Omega$/sq) | Length act as 500 $\Omega$ (line width is 1 micrometer) |
|---|---|---|---|
| Tungsten (W) | 5.5 | 0.55 | 900 micrometer |
| Molybdenum (Mo) | 5.6 | 0.56 | 900 micrometer |
| Tantalum (Ta) | 13.5 | 1.35 | 370 micrometer |

Since it is necessary to use a line resistor 10000 micrometers in length at 1 micrometer in width in order to form the resistor 26 of 5(k$\Omega$) using the metallic thin films, as shown in FIG. 3, it is formed as a coiled pattern. That is, since the sheet resistance value of such metal is relatively small as shown in Table 1, in order to obtain high resistance, the length of the metallic thin film becomes quite long. In addition, in FIG. 3, in order to simplify the figure, the gate electrode 22 and the field plate electrode 25 are shown in a straight line.

Second Embodiment

Figure 4:
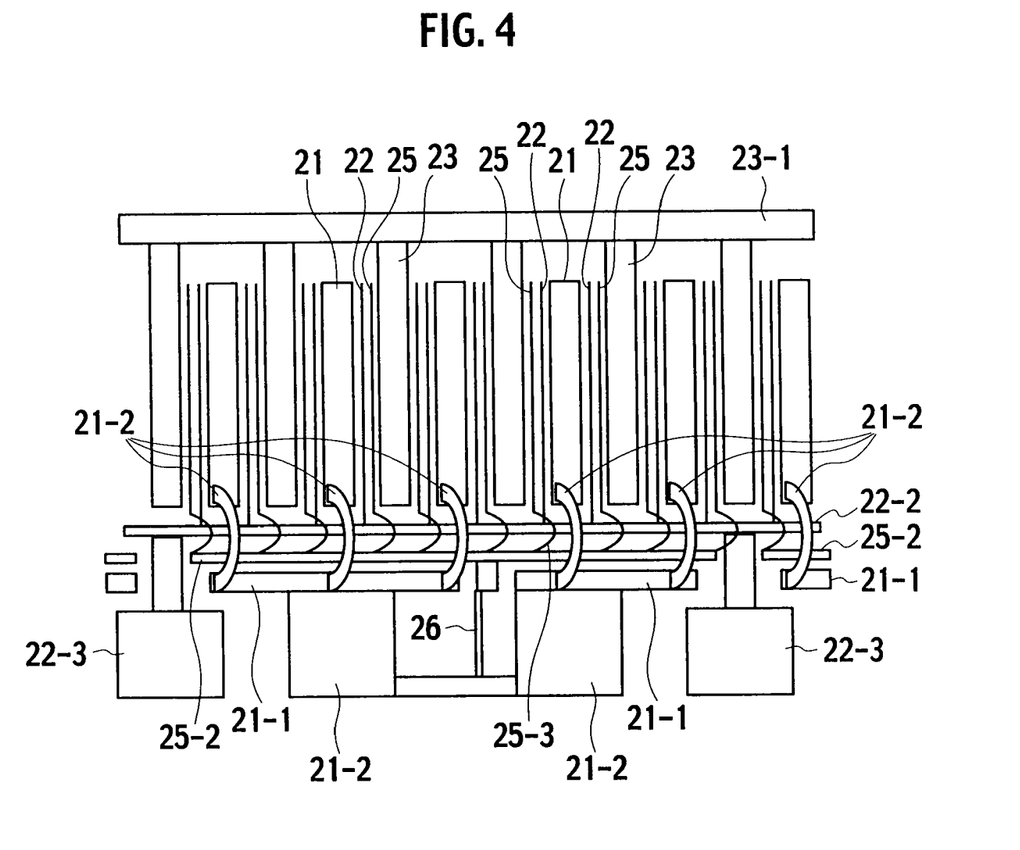
FIG. 4 A schematic plane pattern configuration diagram showing electrode placement of the semiconductor device according to a second embodiment of the present invention.

FIG. 4 shows a schematic plane pattern configuration diagram showing electrode placement of a semiconductor device according to a second embodiment of the present invention.

In the multi-finger type compound semiconductor device according to the second embodiment of the present invention, about 100 couples of one couple of the electrode patterns shown in FIG. 3 are disposed repeatedly. That is, in the semiconductor device, the source electrode 21, the gate electrode 22, the drain electrode 23, and the field plate electrode 25 are repeatedly disposed in a horizontal direction. At this point, although the gate electrode 22 and the field plate electrode 25 are shown in a straight line in order to simplify the figure, they act as pattern arrangements as actually shown in FIG. 2.

A plurality of drain electrode 23 is connected to a common drain electrode wiring 23-1 with those top ends. The gate electrode 22 is connected to a common wiring 22-2 for gate electrodes with those bottom ends. The wiring 22-2 for gate electrodes is connected to the continuous predetermined number, for example, a gate electrode pad 22-3 provided one piece every five gate electrodes 22. The field plate electrode 25 is connected to the continuous predetermined number, for example, a wiring 25-2 for field plate electrodes provided in common every ten field plate electrodes 25, through a bridge wiring 25-3. The source electrode 21 is connected to the continuous predetermined number, for example, a wiring 21-1 for source electrodes which are those common bottom ends every five, through a bridge wiring 21-2. The wiring 21-1 for source electrodes is connected to the source electrode pad 21-2 disposed between the two adjoining gate electrode pads 22-3. The resistor 26 of stripe shape is connected between the wiring 25-2 for field plate electrodes and the source electrode pads 21-2.

At this point, the source electrode wiring 21-1 is mostly separated in the central part. The resistor 26 is connected to the source electrode pad 21-2 through a gap where the source electrode wiring 21-1 is separated.

As mentioned above, in this kind of semiconductor device, around 100 multi-finger arrays usually are disposed and are formed. In the present invention, value of resistance of the resistor 26 can be lowered to 50 ($\Omega$) by connecting the ten field plate electrodes 25 to the source electrode 21 through the one resistor 26.

Third Embodiment

FIG. 5(a) shows a schematic plane pattern configuration diagram of a semiconductor device according to a third embodiment of the present invention. Moreover, FIG. 5(b) shows a schematic plane pattern configuration diagram of the semiconductor device according to a modified example of the third embodiment of the present invention.

As the semiconductor device according to the third embodiment of the present invention is shown in FIG. 5(a), for all the field plate electrodes 25, the common wiring 25-2 for field plate electrodes is provided, and the resistor 26 is provided between the both ends and the source electrode pad 21-2. The value of resistance of the resistors 26 can be managed for about 100Ω.

Figure 5:
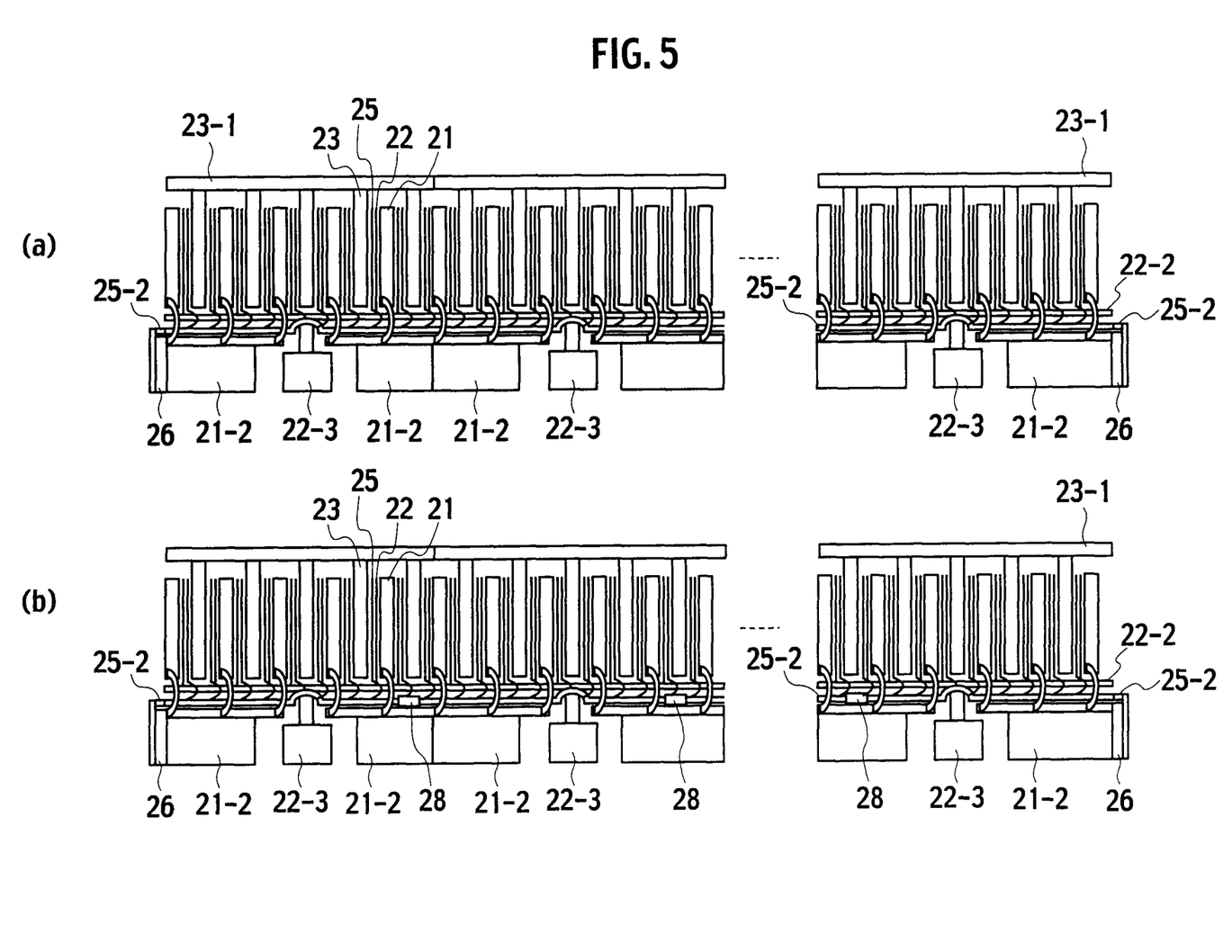

Moreover, in the semiconductor device according to a modified example of the third embodiment of the present invention, as shown in FIG. 5(b), although the common wiring 25-2 for field plate electrodes is provided for all the field plate electrodes 25, a split resistor 28 is inserted for every about ½ length of the wavelength of the high frequency signal to be used in order to control an oscillation accompanying the wiring becoming long. In addition, since other parts of FIG. 5 are almost the same as the configuration of each part of FIG. 4, the same reference numeral is attached to a corresponding part, and detailed explanation is omitted.

Fourth Embodiment

Figure 6:
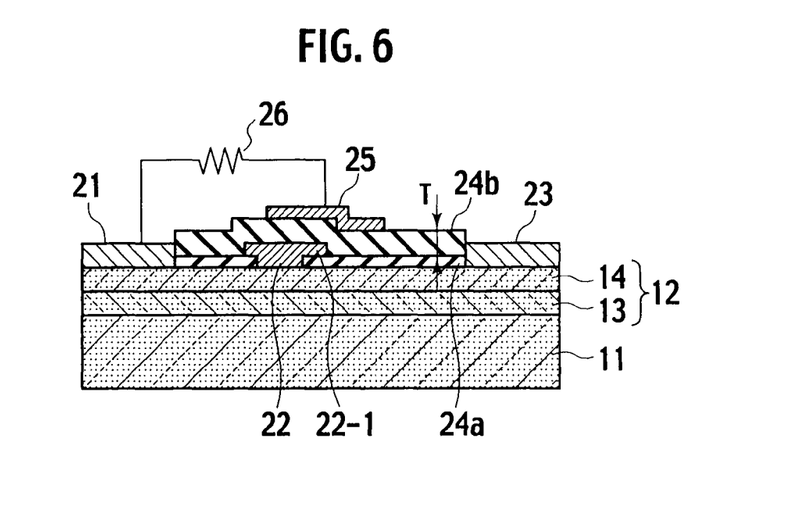
FIG. 6 A schematic section structure view of a semiconductor device according to a fourth embodiment of the present invention.

FIG. 6 shows a schematic section structure view of a semiconductor device according to a fourth embodiment of the present invention.

As shown in FIG. 6, as for the semiconductor device according to the fourth embodiment of the present invention, although it differs in a point that the field plate electrode 22-1 provided in the gate electrode 22 is formed and as a result, a point that the insulating film 24 formed in the compound semiconductor layer 12 surface has two layers (a first insulating film 24a and a second insulating film 24b) as compared with the first embodiment shown in FIG. 1, other configurations are almost the same. Therefore, in FIG. 6, the same reference numerals are attached to the same components as the components of FIG. 1, and detailed explanation is omitted.

In the compound semiconductor device composed in this way, for example, when the source electrode 21 is into ground potential, i.e., 0(V), and DC bias voltage of −5(V) is applied to the gate electrode 22 and DC bias voltage of +50(V) is applied to the drain electrode 23, and a high frequency signal is supplied between the source electrode 21 and the gate electrode 22, an amplified high frequency signal is output to the drain electrode 23. At this time, although a high voltage of 55(V) is applied between the gate electrode 22 and the drain electrode 23, since the field plate electrode 25 is provided, electric field concentrations are alleviated and collapse of the element by destruction of the insulating film 24a and the insulating film 24b is avoided.

That is, since the field plate electrode 25 is separated through the insulating film 24a and the insulating film 24b for the gate electrode 22, a direct current does not flow into between them. However, since the field plate electrode 25 is connected to the source electrode 22 through the resistor 26, the direct current potential is maintained to 0(V). Accordingly, the electric field concentrations for the gate electrode 22 can be alleviated.

On the other hand, since the field plate electrode 25 is connected to the gate electrode 22 through low impedance formed by the parasitic capacitance between the field plate electrode 25 and the gate electrode 22 for a high frequency signal, and high frequency current flows into the resistor 26, the field plate electrode 25 can be substantially changed into an open state from the gate electrode 22 by enlarging the value of resistance enough, and the parasitic capacitance between the field plate electrode 25 and the gate electrode 22 can be reduced.

In the semiconductor device according to the fourth embodiment of the present invention, even if film thickness of the second insulating film 24b is made small enough, amplification gain as a transistor element cannot be reduced, and an alleviation function of the electric field concentrations by the field plate electrode 25 can fully be exhibited.

Fifth Embodiment

Figure 7:
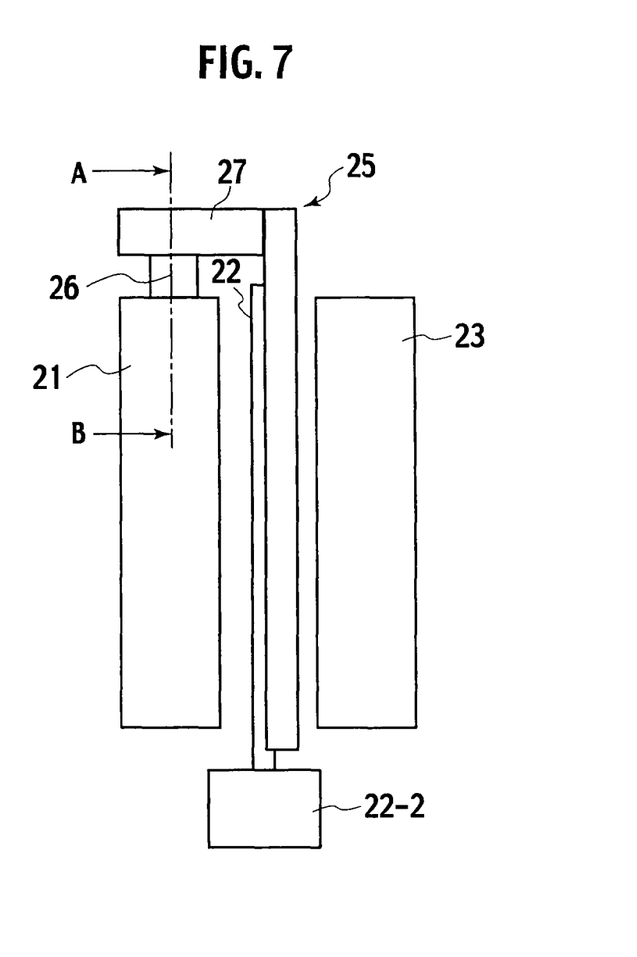
FIG. 7 A schematic plane pattern configuration diagram showing electrode placement of a semiconductor device according to a fifth embodiment of the present invention.

FIG. 7 shows a schematic plane pattern configuration diagram showing electrode placement of a semiconductor device according to a fifth embodiment of the present invention. Moreover, FIG. 8 shows a schematic section structure view taken in the broken chain line A-B in FIG. 7.

Figure 8:
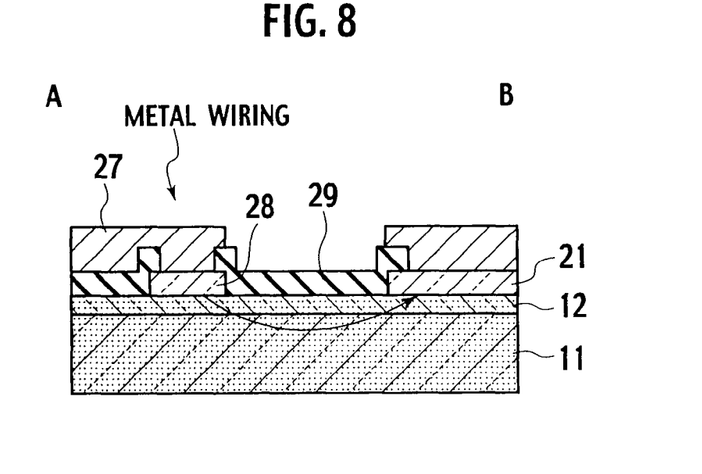
FIG. 8 A schematic section structure view taken in the broken chain line A-B in FIG. 7.

The semiconductor device according to the fifth embodiment of the present invention includes the gallium nitride based compound semiconductor layer 12 formed in the substrate 11, as shown in FIG. 7 and FIG. 8. The compound semiconductor layer 12 includes the GaN layer 13 formed on the substrate 11, and the AlGaN layer 14 formed on the GaN layer 13. The source electrode 21, the gate electrode 22, and the drain electrode 23 are provided on the surface of the compound semiconductor layer 12, i.e., the surface of the AlGaN layer 14.

At this point, the source electrode 21 and the drain electrode 23 are formed, for example by a conductor of stripe shape of Al, and are installed by ohmic contact for the AlGaN layer 14. Moreover, the gate electrode 22 is formed, for example by a conductor of stripe shape of Au, and is installed by the Schottky contact for the AlGaN layer 14. The insulating film 24 such as a nitride film is formed on the surface of the AlGaN layer 14 at apart except for the source electrode 21, the gate electrode 22 and the drain electrode 23, for example.

On the insulating film 24, as shown in FIG. 7, the field plate electrode 25 which is the fourth electrode in which the width direction end part overlaps with the gate electrode 22, and the width direction other end is extended in the drain electrode 23 direction is formed. The field plate electrode 25 is formed by a stripe shaped conductor of Al, for example. The field plate electrode 25 is connected to the source electrode 21 through the resistor 26, which has a high value of resistance. As for the resistor 26, a sheet resistance is formed through an insulating layer on the compound semiconductor layer 12, one end is connected to upper limit of the source electrode 21, and the other end is connected to upper limit of the field plate electrode 25 through the wiring member 27.

In FIG. 8, the substrate 11 and the gallium nitride based compound semiconductor layer 12 are the same as those of the semiconductor device shown in FIG. 1. The terminal member 28 and the source electrode 21 which consist of Ti/Al are vapor-deposited on the surface of the compound semiconductor layer 12, forming ohmic-contact to the AlGaN layer 14. The surface of terminal member 28 and source electrode 21 is covered by an insulating layer 29 of SiN, $SiO_2$ or the like. In the insulating layer 29, contact holes are formed by an RIE (Reactive Ion Etching) method etc., on the wiring member 27 and the surface portion of the source electrode 21 and the wiring member 27 and the below-mentioned bridge wiring 21-2 are connected through each of the contact holes.

In the compound semiconductor device composed in this way, for example, when the source electrode 21 is into ground potential, i.e., 0V, and DC bias voltage of −5V is applied to the gate electrode 22 and DC bias voltage of +50(V) is applied to the drain electrode 23, and a high frequency signal is applied between the source electrode 21 and the gate electrode 22, an amplified high frequency signal is output to the drain electrode 23. At this time, although a high voltage of 55V is applied between the gate electrode 22 and the drain electrode 23, since the field plate electrode 25 is provided on the gate electrode 22, electric field concentrations are alleviated and collapse of the element is avoided.

That is, since the field plate electrode 25 is separated from the gate electrode 22 through the insulating film 24, a direct current does not flow into between them. However, since the field plate electrode 25 is connected to the source electrode 22 through the resistor 26, the DC potential is maintained to 0V. Accordingly, the electric field concentrations for the gate electrode 22 can be alleviated. On the other hand, although the field plate electrode 25 is connected to the gate electrode 22 for a high frequency signal through low impedance formed by the parasitic capacitance between the field plate electrode 25 and the gate electrode 22, since the resistor 26 of a high value of resistance intervenes, the impedance between the source electrode 21 and the gate electrode 22 is controlled by the value of resistance of the resistor 26, the influence of low impedance formed by the parasitic capacitance between the field plate electrode 25 and the gate electrode 22 can be ignored by enlarging the value of resistance enough, and it can change into an open state substantially. Therefore, the alleviation function of the electric field concentrations by the field plate electrode 25 can fully be exhibited, without reducing the amplification gain of the transistor element, by making film thickness of the insulating film 24 small enough.

Sixth Embodiment

Figure 9:
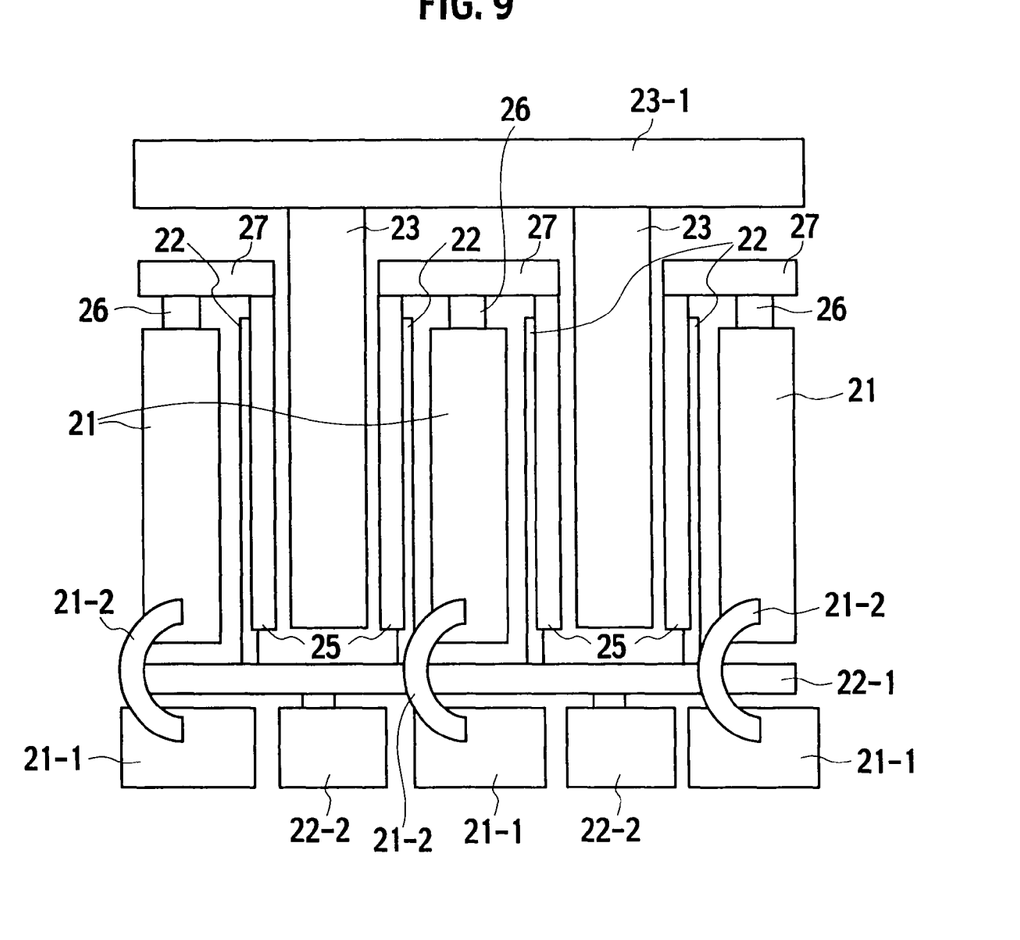
FIG. 9 A schematic plane pattern configuration diagram showing a electrode structure of a multi-finger type semiconductor device according to a sixth embodiment of the present invention.

FIG. 9 shows a schematic plane pattern configuration diagram showing a part of electrode structure of a multi-finger type semiconductor device according to a sixth embodiment of the present invention.

In the semiconductor device according to the sixth embodiment of the present invention, as shown in FIG. 9, a plurality of couples (for example, about 100 couples) of one couple of electrode patterns shown in FIG. 7 are disposed repeatedly. In FIG. 9, four couples of unit FET, which is composed of the source electrode 21, the gate electrodes 22, the drain electrodes 23, and the field plate electrodes 25 are repeatedly disposed in a horizontal direction.

The drain electrode 23 is connected to a drain electrode wiring 23-1 with those common top ends. Each gate electrode 22 is connected to a wiring 22-1 for gate electrodes with those common bottom ends. The wiring 22-1 for gate electrodes is connected to a plurality of gate electrode pads 22-2, which are disposed in a horizontal direction in the lower side of the electrode array. Each source electrode 21 is connected to a gate electrode pad 22-2 and a plurality of source electrode pads 21-1 are disposed by turns through a bridge wiring 21-2 in a horizontal direction in a lower part of the electrode array.

The resistor 26, which is sheet resistance, is disposed so as to connect between the top end of each source electrode 21 and each wiring member 27.

A sheet resistance value or a surface resistance value of the resistor 26 is determined to have a sufficiently high value compared with impedance of parasitic capacitance between the field plate electrode 25 and the gate electrode 22 for high frequency signal used. Since the sheet resistance value is high compared with metal resistance, its occupation area of the resistor 26 on the semiconductor element is small. The sheet resistance value of semiconductor resistance formed on the semiconductor layer 12 through the insulating layer mentioned above is 500 ($\Omega$/sq), for example.

Therefore, in the semiconductor device according to the sixth embodiment of the present invention, since the sheet resistance of semiconductor resistance is used, an element area of high power FET is made small. Accordingly, the high power FET is created easy.

Moreover, by placing both the sheet resistance 26 and the wiring member 27 at the drain electrode pad 23-1 side of the electrode array, generating of parasitic capacitance is decreased by avoiding intersection wiring with gate electrode wiring from the gate electrode 25 to the gate electrode pad 22-2, and the operating characteristic of FET in a high frequency range does not deteriorate.

Seventh Embodiment

Figure 10:
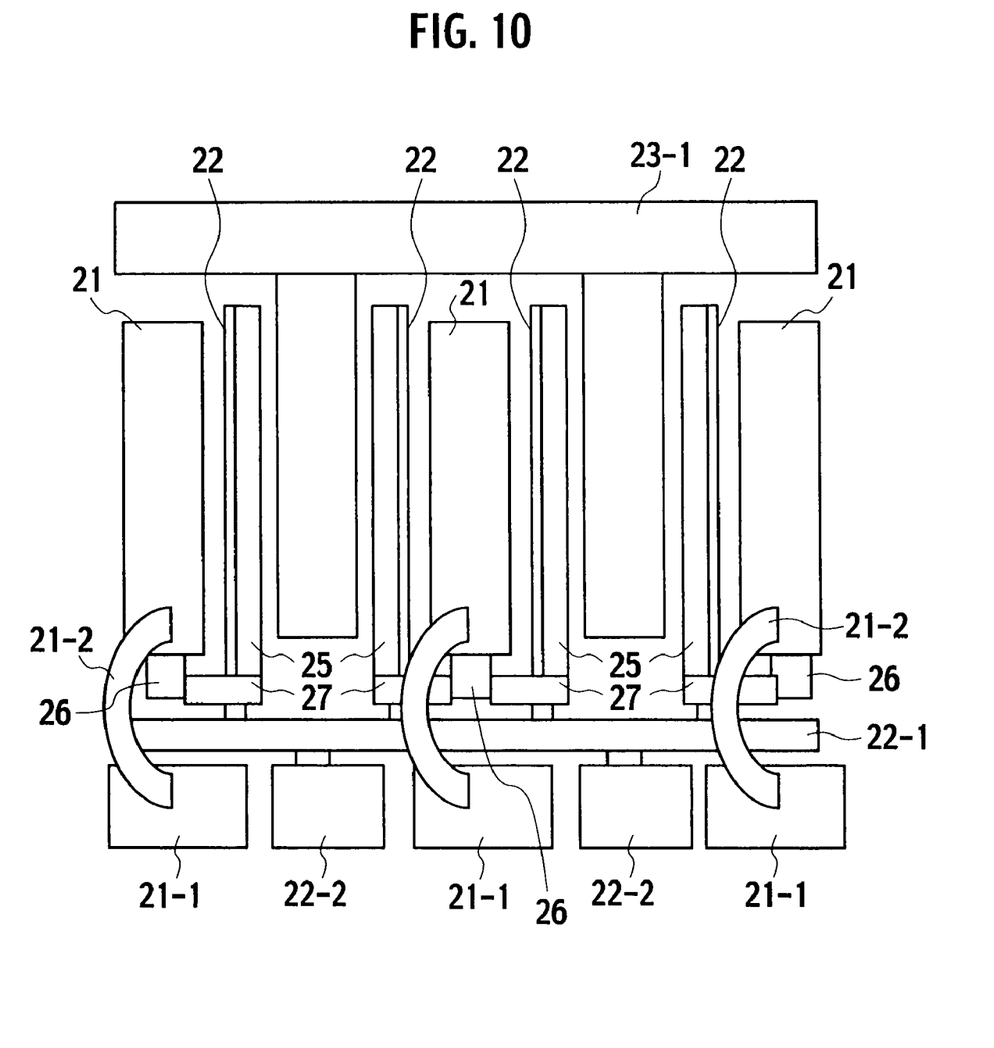
FIG. 10 A schematic plane pattern configuration diagram showing the electrode structure of the multi-finger type semiconductor device according to a seventh embodiment of the present invention.

FIG. 10 shows a schematic plane pattern configuration diagram showing a part of electrode structure of a multi-finger type semiconductor device according to a seventh embodiment of the present invention.

Although the sheet resistance is disposed at the drain electrode pad 23-1 side in the semiconductor device according to the sixth embodiment of the present invention shown in FIG. 9, the sheet resistance is disposed at the source electrode pad 21-1 side and the gate electrode pad 22-2 side in the semiconductor device according to the seventh embodiment of the present invention.

That is, the resistor 26 is disposed, respectively so as to connect between the bottom end of the source electrode 21 and the wiring members 27. Since structure of the resistor 26 and other electrode patterns are the same as the resistor shown in FIG. 8 and the electrode pattern shown in FIG. 9, respectively, detailed explanation is omitted.

Moreover, since the sheet resistance is used on a compound semiconductor layer in the semiconductor device according to the seventh embodiment of the present invention, it can also make small the element area of high power FET.

Moreover, according to the semiconductor devices according to the sixth embodiment and seventh embodiment of the present invention, it can create high power FET easily in spite of the top or the bottom of the position of sheet resistance.

Thus, according to the semiconductor device of the embodiment, since the occupation area of the resistor becomes small by using the semiconductor sheet resistance, as a result, it can be applied for multi-finger type high power FET without expanding the element area.

Other Embodiments

The present invention has been described by the first to seventh embodiments and its modification, as a disclosure including associated description and drawings to be construed as illustrative, not restrictive. With the disclosure, artisan might easily think up alternative embodiments, embodiment examples, or application techniques.

In addition, the present invention is not limited to the above-mentioned embodiments as they are, and therefore shape can be taken by modifying components in an implementation phase in the scope, which does not deviate from the gist.

Moreover, various inventions can be formed with a proper combination of two or more components currently disclosed by the above-mentioned embodiment. For example, some components may be eliminated from all the components shown in the embodiments. Furthermore, the component covering a different embodiment may be combined suitably.

In addition, the present invention is not limited to the above-mentioned embodiments as they are, and therefore shape can be taken by modifying components in an implementation phase in the scope, which does not deviate from the gist.

For example, although the present invention is applied to MESFET in the above-mentioned embodiments, the semiconductor device of the present invention is not limited to MESFET, but can be applied to an field effect type semiconductor device using a compound semiconductor in a large meaning, such as an HEMT (High Electron Mobility Transistor) which forms a semiconductor layer which consists of GaN/AlGaN on a SiC (carbonization silicon) substrate, a device in which AlGaAs/GaAs based HEMT is formed on a semi insulating GaAs substrate.

Such being the case, the present invention covers a variety of embodiments, whether described or not. Therefore, the technical scope of the present invention is appointed only by the invention specific matter related appropriate scope of claims from the above-mentioned explanation.

According to the present invention, since voltage potential isolated from voltage potential of the source electrode for the high frequency signal, and synchronized with voltage potential of a gate electrode is obtained, by inserting resistance which has a great value of resistance as compared with high frequency impedance between the field plate electrode and the gate electrode in a line connecting between the field plate electrode and the source electrodes. Parasitic capacitance between the field plate electrode and the gate electrode is reduced, and reduction of gain can be prevented. Since voltage drop in resistance is not occurred since current does not flow into inserted resistance as a direct current signal, but voltage potential of the field plate electrode is maintained to the same potential as the source electrode, electric field concentrations in edge of the gate electrode are alleviated.

According to the present invention, since resistance is formed using sheet resistance whose specific resistance is higher than that of a metal resistor, the occupation area of the electrode on the element can be made small, and it can be adapted for a multi-finger type power amplification device. Moreover, since the FET and the resistor can be formed almost simultaneous, a process can be simplified.

The invention claimed is:

1. A semiconductor device comprising:
   a substrate;
   a nitride based compound semiconductor layer disposed on the substrate;
   a source electrode disposed on the semiconductor layer;
   a drain electrode disposed in a position on the semiconductor layer spaced apart from the source electrode;
   a gate electrode disposed on the semiconductor layer between the drain electrode and the source electrode;
   an insulating film disposed on the semiconductor layer and on the gate electrode so as to cover the gate electrode;
   a field plate electrode disposed on the insulating film; and
   a resistor configured to connect between the field plate electrode and the source electrode and to have a greater value of resistance than high frequency impedance of stray capacity between the gate electrode and the field plate electrode.

2. The semiconductor device according to claim 1, wherein: the source electrode, the drain electrode, and the gate electrode are multi-finger electrodes composed of a plurality of finger-shaped conductors disposed in parallel, respectively; the field plate electrode is composed of a plurality of finger-shaped conductors disposed so that a part of the width direction overlaps a plurality of finger-shaped conductors which compose the gate electrode, respectively; and the plurality of finger-shaped conductors which composes the field plate electrode are connected to the source electrode through the resistor, respectively.

3. The semiconductor device according to claim 1, wherein the insulating film has a multilayer structure including a first insulating layer disposed on the semiconductor layer and the gate electrode, and a second insulating layer disposed on the first insulating layer, and a second field plate electrode disposed at the end of the gate electrode is provided between the first insulating layer and the second insulating layer.

4. The semiconductor device according to claim 1, wherein one end of the resistor is connected to the source electrode and other end of the resistor is connected to a wiring member of the field plate electrode through a wiring member crossing over the gate electrode.

5. The semiconductor device according to claim 1, wherein the resistor is disposed on the insulating film formed on the semiconductor layer surface.

6. The semiconductor device according to claim 5, wherein the resistor consists of any one of tungsten, molybdenum, or tantalum.

7. The semiconductor device according to claim 1, wherein one end of the field plate electrode is connected in common through an electrode wiring for field plates and the electrode wiring is connected to the source electrode through the resistor.

8. The semiconductor device according to claim 7, wherein the electrode wiring for field plates is divided into a length less than or equal to one half of the length of a wavelength of an input and output signal and a split resistor is inserted in each division point.

9. The semiconductor device according to claim 7, wherein the electrode wiring for field plates is provided in common for every continuous prescribed number among a plurality of field plate electrodes and is connected to the source electrode through the resistor, respectively.

10. The semiconductor device according to claim 1:
    wherein the resistor is formed by a sheet resistance of the semiconductor layer.

11. The semiconductor device according to claim 10, wherein the field plate electrode further comprises:
    a plurality of field plate electrodes composed of finger-shaped conductors; and
    a wiring member extended and formed in an arrangement direction of each finger part of the source electrode, the drain electrode and the gate electrode, and connected in common to each end part of the plurality of field plate electrodes; wherein
    the wiring member is connected in common with a prescribed number of the field plate electrodes.

12. The semiconductor device according to claim 10, further comprising:
    a plurality of source finger electrodes formed on the semiconductor layer and composed of finger-shaped conductors;
    a plurality of drain finger electrodes formed on the semiconductor layer and composed of finger-shaped conductors; and
    a plurality of gate finger electrodes disposed between a source finger electrode and a drain finger electrode of an adjoining pair among the source finger electrodes and drain finger electrodes, and composed of finger-shaped conductors; wherein
    the resistor is disposed so that a plurality of wiring members provided near the gate finger electrodes along an extending direction of the source finger electrodes and drain finger electrodes are connected to a top end of each source finger electrode.

13. The semiconductor device according to claim 10, further comprising:
   a plurality of source finger electrodes formed on the semiconductor layer and composed of finger-shaped conductors;
   a plurality of drain finger electrodes formed on the semiconductor layer and composed of finger-shaped conductors; and
   a plurality of gate finger electrodes disposed between a source finger electrode and a drain finger electrode of an adjoining pair among the source finger electrodes and drain finger electrodes, and composed of finger-shaped conductors; wherein
   the resistor is disposed so that a plurality of wiring members provided near the gate finger electrodes along an extending direction of the source finger electrodes and drain finger electrodes are connected to a bottom end of each source finger electrode.

* * * * *